United States Patent
Zamboni et al.

(10) Patent No.: US 6,492,585 B1
(45) Date of Patent: Dec. 10, 2002

(54) THERMOELECTRIC DEVICE ASSEMBLY AND METHOD FOR FABRICATION OF SAME

(75) Inventors: John M. Zamboni, Flower Mound, TX (US); Christopher S. Bettis, Plano, TX (US)

(73) Assignee: Marlow Industries, Inc., Dallas, TX (US)

( * ) Notice: Subject to any disclaimer, the term of this patent is extended or adjusted under 35 U.S.C. 154(b) by 69 days.

(21) Appl. No.: 09/802,510

(22) Filed: Mar. 9, 2001

Related U.S. Application Data
(60) Provisional application No. 60/192,300, filed on Mar. 27, 2000.

(51) Int. Cl.[7] .............................................. H01L 35/34
(52) U.S. Cl. ..................... 136/201; 136/203; 136/205; 427/58; 65/59.1; 65/59.5; 438/118; 438/127; 438/54; 438/55
(58) Field of Search ................................. 136/200, 201, 136/203, 205, 237, 241, 242, 204; 252/62.3 T; 427/255.11, 255.12, 282, 58; 438/118, 127, 54, 55; 65/59.5, 59.3, 43, 59.1

(56) References Cited

U.S. PATENT DOCUMENTS

| | | | |
|---|---|---|---|
| 3,079,455 A | 2/1963 | Haba | 136/5 |
| 4,636,254 A | 1/1987 | Husson, Jr. et al. | 106/1.14 |
| 4,761,224 A | 8/1988 | Husson, Jr. et al. | 106/1.14 |
| 4,855,810 A | 8/1989 | Gelb et al. | 357/87 |
| 4,968,738 A | 11/1990 | Dershem | 524/317 |
| 5,064,480 A | 11/1991 | Dershem et al. | 148/22 |
| 5,306,333 A | 4/1994 | Dershem | 106/1.19 |
| 5,358,992 A | 10/1994 | Dershem et al. | 524/439 |
| 5,403,389 A | 4/1995 | Dershem | 106/1.19 |
| 5,429,680 A | 7/1995 | Fuschetti | 136/203 |
| 5,447,988 A | 9/1995 | Dershem et al. | 524/780 |
| 5,489,641 A | 2/1996 | Dershem | 524/439 |
| 5,543,366 A | 8/1996 | Dietz et al. | 501/41 |
| 5,663,109 A | 9/1997 | Dietz et al. | 501/41 |
| 5,817,188 A | 10/1998 | Yahatz et al. | 136/237 |

OTHER PUBLICATIONS

Articles from *Johnson Matthey Electronics*, Product Data, JM6100 (6 pgs). Nov. 19, 1992.
"DuraTEC Series, Thermoelectric Coolers," *Marlow Industries, Inc.*, 1998 No month provided.
"Tiny Heat Pumps Enter Everyday Use," *Basics of Design engineering*, Machine Design, Nov. 7, 1996.
"QMI 3555* Low Temp Ag/Glass Die Attach Paste for Solder and Glass Seal Packages," *Quantum Materials Process Data Sheet*, 1998 No month provided.
"Conductive Adhesives Electronics," *Dexter* 1998 No month provided.

*Primary Examiner*—Nam Nguyen
*Assistant Examiner*—Thomas H. Parsons
(74) *Attorney, Agent, or Firm*—Baker Botts L.L.P.

(57) ABSTRACT

A thermoelectric device operable at below ambient, ambient or high temperatures and a method of fabricating the same is provided. The thermoelectric device is made of first and second ceramic plates. An array of thermoelectric elements are coupled between the plates with metal filled glass. The metal filled glass is capable of attaching the thermoelectric elements to the plates, as well as electrically and thermally coupling the thermoelectric elements to the plates. The thermoelectric devices are fabricated by applying metal filled glass to a plate, positioning thermoelectric elements in the metal filled glass in an electrically serpentine manner and curing the metal filled glass to affix the plates and the thermoelectric elements together.

57 Claims, 5 Drawing Sheets

THERMOELECTRIC DEVICE ASSEMBLY AND METHOD FOR FABRICATION OF SAME

CROSS-REFERENCE TO RELATED APPLICATIONS

This application claims the benefit of U.S. Provisional Application Ser. No. 60/192,300 filed Mar. 27, 2000.

BACKGROUND OF THE INVENTION

1. Field of the Invention

The present invention relates generally to solid state devices and, more particularly, to thermoelectric devices and the fabrication of same using metal filled glass.

2. Description of the Related Art

The basic theory and operation of thermoelectric devices has been developed for many years. Modern thermoelectric devices typically include an array of semiconductor elements or thermocouples which operate by using the Peltier effect. Thermoelectric devices are essentially small heat pumps which follow the laws of thermodynamics in the same manner as mechanical heat pumps, refrigerators, or any other apparatus used to transfer thermal energy. A principal difference is that thermoelectric devices function with solid state electrical components (thermocouples) as compared to more traditional mechanical/fluid heating and cooling components. The efficiency of a thermoelectric device is generally limited to its associated Carnot cycle efficiency reduced by a factor which is dependent upon the thermoelectric figure of merit (ZT) of the materials used in fabrication of the thermoelectric device.

The thermoelectric figure of merit (ZT) is a dimensionless measure of the effectiveness of a thermoelectric device and is related to material properties by the following equation:

$$ZT = S^2 \sigma T / \kappa \quad (1)$$

where S, $\sigma$, $\kappa$, and T are the Seebeck coefficient, electrical conductivity, thermal conductivity and absolute temperature, respectively. The Seebeck coefficient (S) is a measure of how readily the respective carriers (electrons or holes) can change energy in a temperature gradient as they move across a thermoelectric element. The thermoelectric figure of merit is related to the strength of interaction of charge carriers with the lattice structure and the available energy states associated with the respective materials.

The ZT may also be stated by the equation:

$$ZT = \frac{S^2 T}{\rho \kappa} \quad (2)$$

$\rho$=electrical resistivity $\sigma$=electrical conductivity electrical conductivity=1/ electrical resistivity or $\sigma = 1/\rho$ Today's commercially available thermoelectric materials are generally limited to use in a temperature range between 100° K and 1100° K with a maximum ZT value of approximately one. The efficiency of such thermoelectric power generation devices remains relatively low at approximately five to eight percent (5–8%) energy conversion efficiency. For the temperature range of −100° C. to 1000° C., maximum ZT of conventional thermoelectric materials remains limited to values of approximately one (1), except for Te—Ag—Ge—Sb alloys (TAGS) which may achieve a ZT of 1.2 to 1.4 in a very narrow temperature range. Recently developed materials such as $Si_{80}Ge_{20}$ alloys used in thermoelectric generators to power spacecraft for deep space missions have a average thermoelectric figure of merit over the temperature range of operation of approximately 0.5 from 100° C. to 1,000° C.

Thermoelectric cooling and temperature stabilization devices are constructed by positioning semiconductor elements made from such semiconductor alloy families as $Bi_2Te_3$, $Sb_2Te_3$ and $Bi_2Se_3$ between ceramic plates. These semiconductor elements are doped to create either an excess (n-type) or a deficiency (p-type) of electrons. Typical thermoelectric devices of this type are described in U.S. Pat. No. 4,855,810, Gelb et al. According to Gelb et al., these thermoelectric cooling devices contain semiconductor elements soldered to conductors using a solder including bismuth and tin and, in higher temperature applications, gold. One such bismuth tin solder is described in U.S. Pat. No. 3,079,455, Haba. Haba describes a solder formed of tin, antimony, and bismuth.

Thermoelectric devices built with elements composed of bismuth telluride alloy materials are used in applications where they are exposed to temperatures ranging from about −80° C. to about 250° C. The performance of such thermoelectric devices made with a tin-containing solder suffers as a result of long term exposure to wide temperature ranges. In fact, the performance of the thermoelectric devices has been found to decrease about fifteen percent or more per year. Thermoelectric devices made with tin-containing solder are not truly considered serviceable at temperatures substantially above 80° C.

One reason for the lack of serviceability is that the standard bismuth tin solder melts at 138° C. At temperatures above 80° C., the tin in the solder tends to diffuse rapidly into the semiconductor elements and into the crystal lattice of the semiconductor elements, where it acts as a dopant or reacts with material of the elements. Also, the tin forms a film over the surface of the material adjacent to the soldered ends. Once created, the tin film acts as a resistor connected across the elements causing a voltage drop or a short.

Gelb et al. sought to overcome the problems of tin diffusion and resistor formation by replacing the tin-based solder with a lead-antimony solder. However, at elevated temperatures, lead also diffuses and reacts with the thermoelectric semiconductor material to form a region of poor thermoelectric performance.

To prevent diffusion of lead, tin, or other metals from the solder or the copper when used as the interconnect between the elements, the industry standard has been to employ a diffusion barrier between the elements and the solder, such as nickel layered on the elements. Such a system is shown, for example, in U.S. Pat. No. 5,429,680, Fuschetti. However, this technology is very complicated, costly, and does not completely prevent diffusion of the lead, tin or other materials. Furthermore, thermoelectric devices made from material covered at the ends with metal films provide a point of relative weakness and can become a limiting factor in the service life of the device without careful engineering and testing.

BRIEF SUMMARY OF THE INVENTION

In accordance with the teachings of the present invention, a solderless thermoelectric device and method of fabrication are provided.

In one embodiment, the present invention provides a thermoelectric device having a first and a second plate, each plate having a first and second surface. A plurality of interconnects between the elements are operably coupled to the first and second plates to allow the device to be coupled to a power source. An array of thermoelectric elements, having respective first and second ends is preferably disposed between the first plate and the second plate. Metal filled glass (a specific example of metal filled glass, although not limited to, is silver-filled glass) is preferably used to respectively couple the first surface of the first plate and the first ends of the thermoelectric elements and the second ends of the thermoelectric elements to the first surface of the second plate. In this embodiment the metal filled glass replaces the solder traditionally used in this type of device.

In another embodiment, the present invention provides a thermoelectric device having at least one array of alternatively positioned n-type and p-type thermoelectric elements. Each thermoelectric element has a first end and a second end. A plurality of metal filled glass interconnects are provided to connect the first ends of adjacent n-type and p-type thermoelectric elements in series and the second ends of adjacent n-type and p-type thermoelectric elements in series and to subsequently connect the array of n-type and p-type thermoelectric elements in a serpentine manner. First and second leads are operably coupled to the thermoelectric element array and a first and a second plate are preferably operably coupled to the first and second ends of the thermoelectric elements. In this embodiment, the thermoelectric elements will not require diffusion barriers of nickel or other materials.

In yet another embodiment, the present invention provides a method of fabricating a thermoelectric device. The method includes applying metal filled glass in a desired pattern to a first surface of a first plate and to a first surface of a second plate. The method further includes positioning an array of thermoelectric elements, each thermoelectric element having a first end and a second end, on the metal filled glass pattern and then curing the metal filled glass such that the thermoelectric elements are coupled to each plate.

In another embodiment, the present invention provides a method of fabricating a thermoelectric device. The method includes applying metal filled glass to a first surface of a first plate and to at least a first surface of a second plate in a desired pattern. The first ends of adjacent n-type and p-type thermoelectric elements are positioned into the metal filled glass on the first surface of the first plate and the second ends of adjacent n-type and p-type thermoelectric elements are positioned into the metal filled glass on at least the first surface of the second plate such that the n-type and p-type thermoelectric elements are connected in a serpentine manner. The metal filled glass is then cured.

In yet another embodiment, a thermoelectric device is provided. The thermoelectric device includes a first plate and a second plate with respective interconnects formed on a first surface of the first plate and on a first surface of the second plate. A plurality of thermoelectric elements having respective first ends and second ends are provided and disposed between the first and second plates. Metal filled glass is preferably used to couple the first and second ends of each thermoelectric elements with the respective interconnects.

One technical advantage provided by the present invention is a single flow process for the fabrication of thermoelectric devices.

Another technical advantage provided by the present invention is a thermoelectric device operable at temperatures above 325° C.

An additional technical advantage provided by the present invention is a thermoelectric fabrication method which eliminates flux and does not require a cleaning step.

Another technical advantage is the elimination of one or more of the different materials presently used for the diffusion barrier, interconnect, lead wire(s) and solder by using metal filled glass.

Another technical advantage provided by the present invention is thermoelectric device bonds which, once formed, are virtually unaffected at temperatures under 400° C.

An additional technical advantage provided by the present invention is the ability in subsequent phases of assembly to create a high temperature, solderless bond between a thermoelectric device and an external electronic or passive device such as laser diodes, microprocessors, ceramic submounts and the like with little or no adverse effect on the integrity of the thermoelectric device.

An additional technical advantage provided by the present invention is the ability to bond a thermoelectric device with other components such as laser diodes, microprocessors, thermal sinks, etc., at temperatures above 325° C. without causing reflow in the bonding areas of the thermoelectric device.

Other technical advantages will be readily apparent to one skilled in the art from the following figures, detailed description, and claims.

BRIEF DESCRIPTION OF THE DRAWINGS

For a more complete understanding of the present invention, and the advantages thereof, reference is now made to the following written description taken in conjunction with the accompanying drawings, in which.

DETAILED DESCRIPTION OF THE INVENTION

Figure 1:
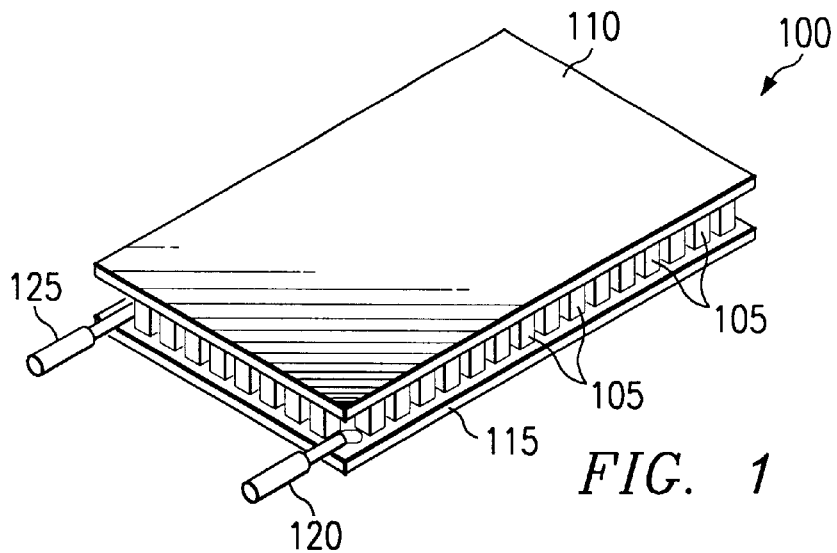
FIG. 1 is an isometric drawing of a thermoelectric device which may be fabricated from materials incorporating teachings of the present invention.

Thermoelectric device 100, as shown in FIG. 1, may be fabricated from semiconductor materials and compounds which have been prepared in accordance with teachings of the present invention. Thermoelectric device 100, as shown, may be used as a heater, a cooler or as a power generation device. Thermoelectric device 100 is preferably fabricated with a plurality of thermoelectric elements (sometimes referred to as "thermocouples") 105 disposed between first plate 110 and second plate 115. Electrical power leads 120 and 125 are provided to allow coupling of thermoelectric device 100 to an appropriate source of electrical power. If thermoelectric device 100 were redesigned to function as an electrical power generator, electrical leads 120 and 125 would represent the output terminals from such a power generator operating between hot and cold temperature sources (not shown).

Figure 2:
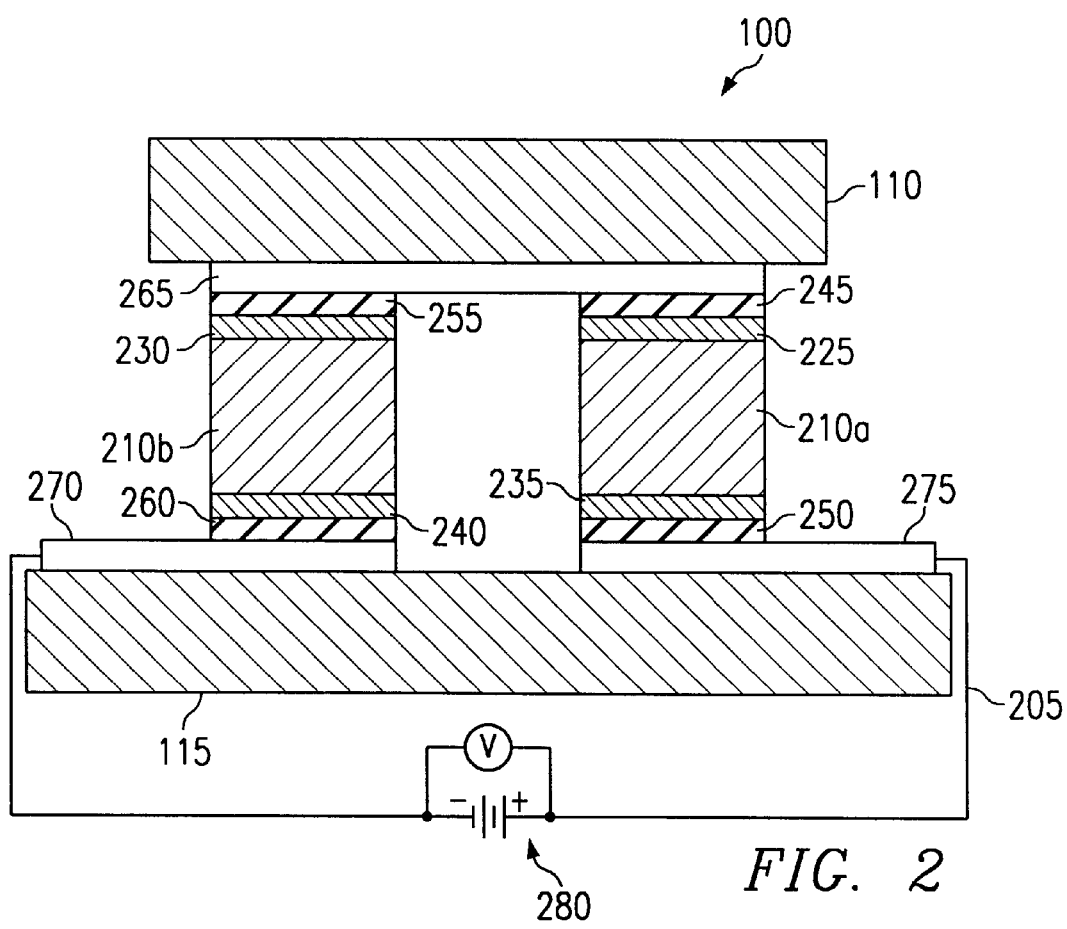
FIG. 2 is an electrical schematic drawing in section with portions broken away of a thermoelectric device incorporating teachings of the present invention.

FIG. 2 is a schematic representation of electrical circuit 205 associated with thermoelectric device 100 in accordance with the present invention. Electrical circuit 205 is also typical of electrical circuits associated with using thermoelectric elements or thermocouples to convert heat energy into electrical energy. Such electrical power generators may be used in waste heat recovery systems (not shown), space power systems (not shown) and radioisotope power generators (not shown).

Electrical circuit 205, which is typical for a single stage thermoelectric device such as thermoelectric device 100, generally includes two dissimilar or similar materials differing in the type of majority current carrier such as n-type thermoelectric elements 210a and p-type thermoelectric elements 210b. Thermoelectric elements 210a and 210b are typically arranged in an alternating n-type element to p-type element serpentine configuration. In almost all thermoelectric devices, semiconductor materials with these characteristics are connected electrically in series and thermally in parallel.

N-type semiconductor materials have more electrons than necessary to complete a perfect molecular lattice structure. P-type semiconductor materials have fewer electrons than necessary to complete a lattice structure. The "missing electrons" are sometimes referred to as "holes." The extra electrons in the n-type semiconductor material and the holes in the p-type semiconductor material (hereinafter referred to as "carriers") are the agents, coupled with lattice vibrations (referred to as "phonons"), which transport or move thermal energy between first plate 110 and second plate 115 coupled to thermoelectric elements 210a and 210b. Ceramic materials are frequently used in the fabrication of plates 110 and 115 which define in part the cold side and hot side, respectively, of thermoelectric device 100.

In thermoelectric device 100, alternating thermoelectric elements of n-type 210a and p-type 210b semiconductor materials can have their ends connected in a serpentine fashion by attaching a diffusion barrier 225, 230, 235, and 240 to alternating ends of thermoelectric elements 210a and 210b. Bonding joints 245, 250, 255 and 260 can then be attached to electrical interconnects (usually copper or aluminum) 265, 270 and 275 to fix thermoelectric elements 210a and 210b between first plate 110 and second plate 115. Interconnects 265, 270 and 275 are typically metallizations formed on the surfaces of plates 110 and 115. However, in certain of the embodiments of this invention the interconnect is the metal filled glass itself.

During operation, electrical power is applied from power supply 280 to thermoelectric device 100 having an array of thermoelectric elements 210a and 210b. In one example, thermal energy can be absorbed by first plate 110 coupled to thermoelectric elements 210a and 210b. The thermal energy passes through thermoelectric elements 210a and 210b and is dissipated by second plate 115. In this example, a thermal sink (sometimes referred to as the "hot sink", not expressly shown) may be attached to second plate 115 of thermoelectric device 100 to aid in dissipating thermal energy from thermoelectric elements 210a and 210b to the adjacent environment. In a similar manner a thermal sink (sometimes referred to as a "cold sink", not expressly shown) may be attached to first plate 110 of thermoelectric device 100 to aid in removing thermal energy from the adjacent environment. Thermoelectric device 100 may sometimes be referred to as a thermoelectric cooler. However, since thermoelectric devices are a type of heat pump, thermoelectric device 100 may function as either a cooler, heater, or power generator.

Figure 3:
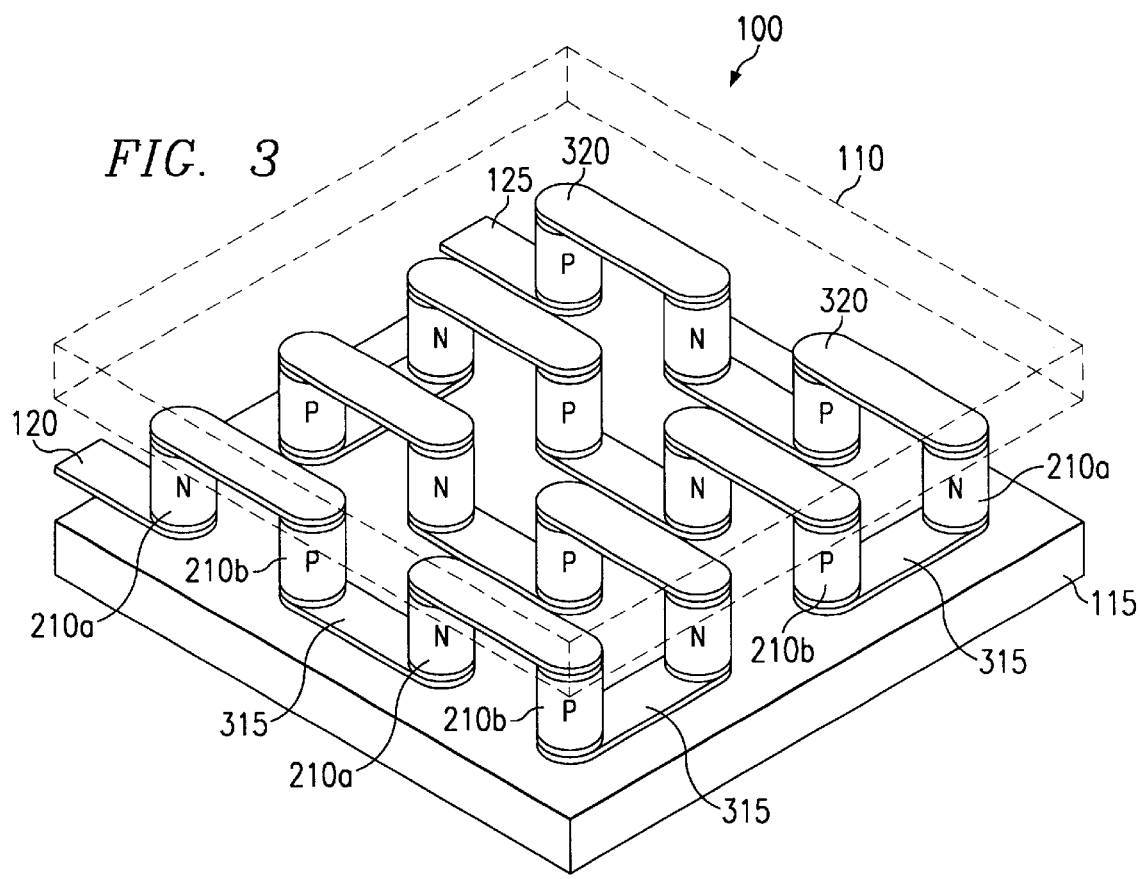
FIG. 3 shows a perspective view with portions broken away of a thermoelectric device fabricated from materials incorporating teachings of the present invention.

Referring now to FIG. 3, a perspective view of a thermoelectric device fabricated from materials incorporating the present invention is shown. Thermoelectric device 100 is fabricated using first plate 115 and second plate 110, shown in phantom. Interconnects 315 and 320 are coupled to first plate 115 and second plate 110 respectively. Interconnects 315 and 320 generally serve to electrically couple n-type thermoelectric elements 210a and p-type thermoelectric elements 210b in the serpentine manner illustrated. Leads 120 and 125 are included on thermoelectric device 100 to allow a power source to be coupled to thermoelectric device 100 or to allow thermoelectric device 100 to output power.

In the embodiment of thermoelectric device 100 illustrated in FIG. 3, metal filled glass is used to create interconnects 315 and 320. The metal filled glass compound used to create interconnects 315 and 320, chosen for its high temperature and solderless characteristics, is similar to a silver filled glass compound made by The Dexter Corporation known as QMI 3555.

In order to obtain electrical characteristics comparable to copper interconnects, metal filled glass interconnects 315 and 320 are preferably created with a thickness of approximately 1 to 10 mils. During the curing process of the metal filled glass, it is common for any organic matter in the metal filled glass to burn out, thereby resulting in a significantly thinner, hardened interconnect which through appropriate design can have copper-like electrical properties.

In addition to interconnects 315 and 320, silver or metal filled glass may also be used in the preferred embodiment as the bonding agent functioning to hold thermoelectric elements 210a and 210b to first plate 115 and second plate 110 and/or to form a diffusion barrier on each end of thermoelectric elements 210a and 210b. This bonding agent can also function to hold first plate 115 and second plate 110 in position once oriented.

In an alternate embodiment, interconnects 315 and 320 can be made from other materials such as copper, aluminum or other electrically conductive material. In such an embodiment, first plate 115 and second plate 110 would have a series of interconnects deposited, such as by chemical vapor deposition or screen printing, onto a surface of each plate. Thermoelectric elements 210a and 210b would then be bonded to the interconnects by applying metal filled glass to respective ends of thermoelectric elements 210a and 210b and then bonding the respective ends with an interconnect. Alternatively, the metal filled glass may be applied first to the interconnects at desired locations and then thermoelectric elements 210a and 210b may be positioned onto the metal filled glass locations.

In yet another embodiment, a diffusion barrier made from such material as nickel, similar to diffusion barrier 225 of FIG. 2, may be included on the ends of thermoelectric elements 210a and 210b. Placing a diffusion barrier between the respective ends of thermoelectric elements 210a and 210b and the metal filled glass bonding joints or interconnects can prevent the metal in the metal filled glass from diffusing into thermoelectric elements 210a and 210b.

In addition to using metal filled glass as interconnects, as a thermoelectric element bonding material configurable with a diffusion barrier, and/or as a plate bonding material, the present invention also employs metal filled glass as the bonding agent for coupling components to first plate 115 and/or second plate 110. Examples of such components include, but are not limited to, integrated circuits (ICs), microprocessors, ceramic submounts, laser diodes, thermal sinks, and additional thermoelectric devices or elements.

Figure 4:
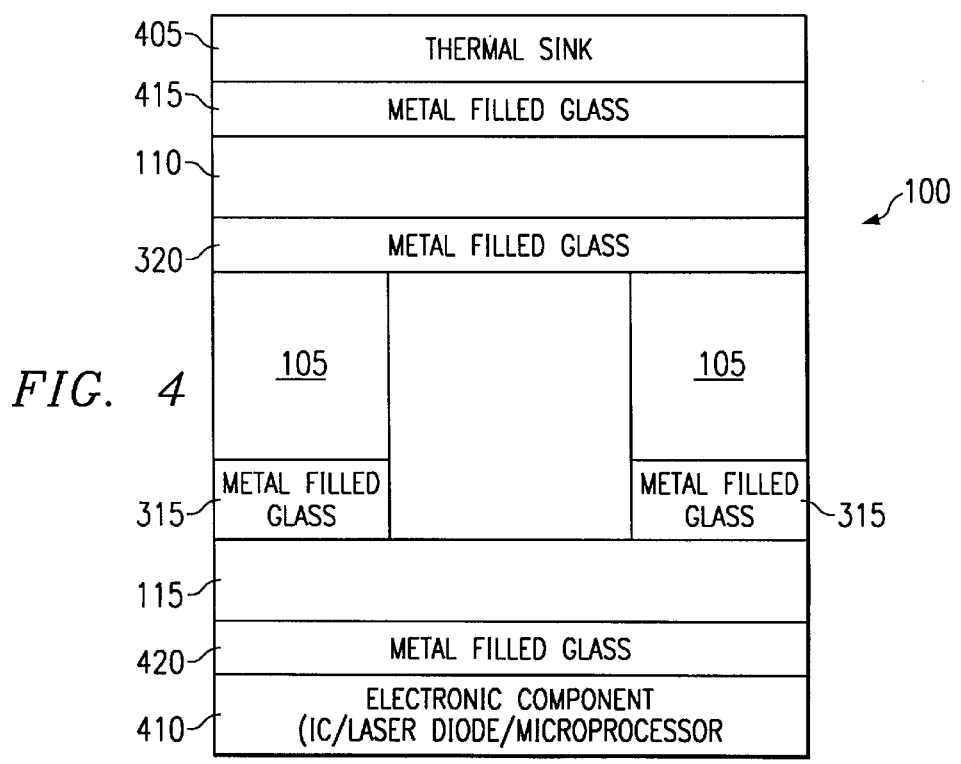
FIG. 4 illustrates a block diagram of a thermoelectric device incorporating teachings of the present invention.

Referring now to FIG. 4, a block diagram of a thermoelectric device incorporating teachings of the present invention is shown. In FIG. 4, thermoelectric device 100 is shown coupled to thermal sink 405 and electronic component 410. As indicated, metal filled glass may be used to bond thermal sink 405 to plate 110 at 415 and to bond electronic component 410 to plate 115 at 420. Electronic component 410 can be a laser diode, a microprocessor, an integrated circuit (IC) or any other device which might benefit from the effects of thermoelectric device 100.

Figure 5:
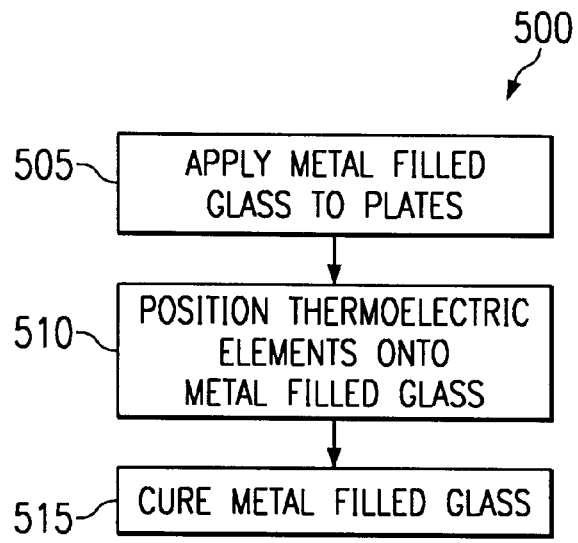
FIG. 5 illustrates a single flow method for fabricating the thermoelectric device of FIG. 3.

Referring now to FIG. 5, a single flow method of fabricating a thermoelectric device, such as thermoelectric device 100, is shown according to one embodiment of the present invention. Method 500 can be referred to as a single flow method, in one aspect, due to its simplicity of implementation. As illustrated, method 500 can be implemented in an "assembly line" manner. For example, first plate 110 can be carried along a belt driven apparatus through a screening stage in which a desired metal filled glass interconnect pattern is also applied. Following first plate 110 along the belt driven apparatus is second plate 115 to which a desired metal filled glass interconnect pattern is applied. As first plate 110 and second plate 115 proceed, first plate 110 has an array of thermoelectric elements positioned onto the appropriate areas of the metal filled glass interconnect pattern. Once the thermoelectric element array is positioned onto first plate 110, second plate 115 can be appropriately positioned onto the end of the thermoelectric element array opposite the end positioned on first plate 110. The belt driven apparatus can then proceed the newly created device through a belt furnace to harden the metal filled glass interconnect patterns and cure the thermoelectric device. The result is a thermoelectric device similar to thermoelectric device 100.

Method 500 begins at step 505 with the application of metal filled glass into desired interconnect patterns on a series of ceramic plates. Metal filled glass can be applied using a variety of methods including, but not limited to, screening and dispensing.

Once the metal filled glass has been applied to the ceramic plates in the desired interconnect pattern at step 505, method 500 proceeds to step 510 for the positioning of the thermoelectric elements at the metal filled glass interconnect regions. As previously discussed, alternating n-type thermoelectric elements and p-type thermoelectric elements in a serpentine manner creates a high efficiency thermoelectric device. As such, at step 510, n-type and p-type thermoelectric elements are alternatively positioned at the metal filled glass interconnect regions of the ceramic plates such that once the plates having the metal filled glass interconnect patterns are brought together, a serpentine thermoelectric element configuration is achieved.

After the thermoelectric elements have been positioned at the metal filled glass interconnect regions of the ceramic plates and the ceramic plates brought together, the thermoelectric device is then cured to solidify or harden the liquid metal filled glass at step 515. Curing begins by baking the device until the metal filled glass completes processing.

Baking is preferably performed by gradually heating the metal filled glass to a temperature around 300°–400° C. over a 7–10 minute time period. The thermoelectric device is then baked at 325° C. for approximately 5–10 minutes. At 325° C., the organics in the metal filled glass are burned out and the glass in the metal filled glass compound flows into the open areas within the metal filled glass, compressing the metal filled glass interconnect regions approximately 30%. As previously mentioned, the cured or hardened metal filled glass interconnects, bonds, etc., are reduced in thickness from their applied dimensions. After baking, the device is allowed to gradually cool. Other time constraints and temperature constraints, typically dependent upon the specific metal filled glass compound used, are contemplated by the present invention.

To fabricate a multistage thermoelectric device, a metal filled glass interconnect pattern would be applied to an exterior surface of the thermoelectric device created at step 510 of method 500 and to a third plate which is to be used as an outer plate for the multistage thermoelectric device. After applying the metal filled glass interconnect patterns, thermoelectric elements are then positioned in the alternating, serpentine manner described above. The multistage thermoelectric device can then be cured in a manner similar to that of step 515 in method 500. Additional stages can be added in much the same manner.

Figure 6:
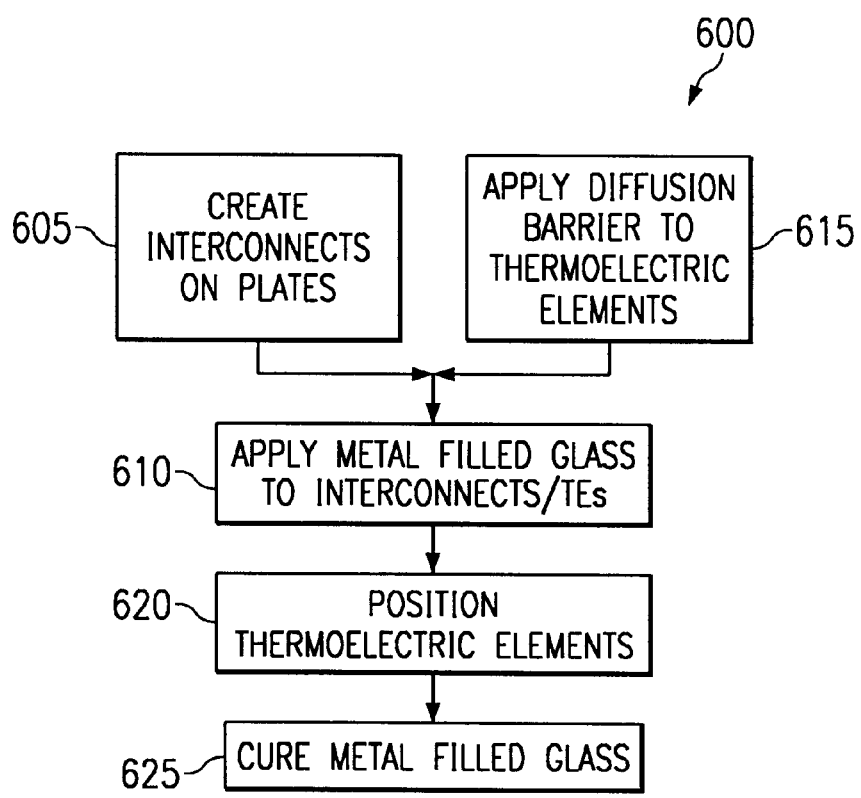
FIG. 6 illustrates a multi-flow method for fabricating a thermoelectric device in accordance with teachings of the present invention.

Referring now to FIG. 6, a method illustrating the utilization of metal filled glass as a bonding agent for the fabrication of a thermoelectric device is shown. Contrasted with the single flow process performed in method 500 of FIG. 5, method 600 is a multi-flow process which begins at step 605.

At step 605, interconnects, such as copper, are deposited on the thermoelectric device plates. Copper is typically deposited onto thermoelectric device plates by chemical vapor deposition, screen printing or other similar processes. Once the interconnects are deposited, metal filled glass can be applied to the regions of the interconnects intended to electrically couple to respective ends of the thermoelectric elements at step 610. If, in the thermoelectric device being created, the thermoelectric elements require a diffusion barrier on one or more respective end, a diffusion barrier is created on respective ends of the thermoelectric elements at step 615, typically in a separate process and preferably before application of the metal filled glass to the interconnects.

Once the thermoelectric elements and the thermoelectric device plates are appropriately prepared, the thermoelectric elements are positioned onto the applied metal filled glass regions. Again, a serpentine, alternating n-type and p-type thermoelectric element configuration is created between the thermoelectric device plates at step 620. The thermoelectric device is then cured at step 625 in a manner similar to that mentioned with respect to method 500 of FIG. 5. Multistage thermoelectric devices can also be produced using method 600 of FIG. 6.

In some instances, it may be desirable to couple one or more components to a thermoelectric device created by method 500 or 600. For example, it may be determined that a thermal sink needs to be coupled to the thermoelectric device created. In this scenario, metal filled glass is applied to the appropriate exterior surface of the thermoelectric device to which the thermal sink will be bonded, similar to that illustrated in FIG. 4. After application of the metal filled glass, the component would then be positioned onto the metal filled glass. Once the component is positioned, the metal filled glass bond between the component and the thermoelectric device is hardened by curing the entire apparatus in a manner similar to that mentioned above with reference to FIG. 5.

In a preferred embodiment, the thermoelectric device itself is cured before attaching a thermal sink and/or an electronic component to the thermoelectric device. In this embodiment, metal filled glass is applied to the surface of the thermoelectric device to which attachment is desired, for example, after step 515 or 625. Once the metal filled glass is applied, the component and/or thermal sink is positioned and the entire apparatus is then cured. During this curing stage, which is similar to the curing process described above, the metal filled glass between the attached electronic component or thermal sink is hardened. The metal filled glass used within the thermoelectric device, such as for interconnects, bonding joints, diffusion barriers, etc., once cured, does not experience reflow during this additional curing step. Unlike conventional soldering compounds, metal filled glass does not experience reflow at the same temperature it is cured. Metal filled glass has the characteristic of being reworkable only at temperatures greater than approximately 50° C. above its preferred curing temperature.

Figure 7:
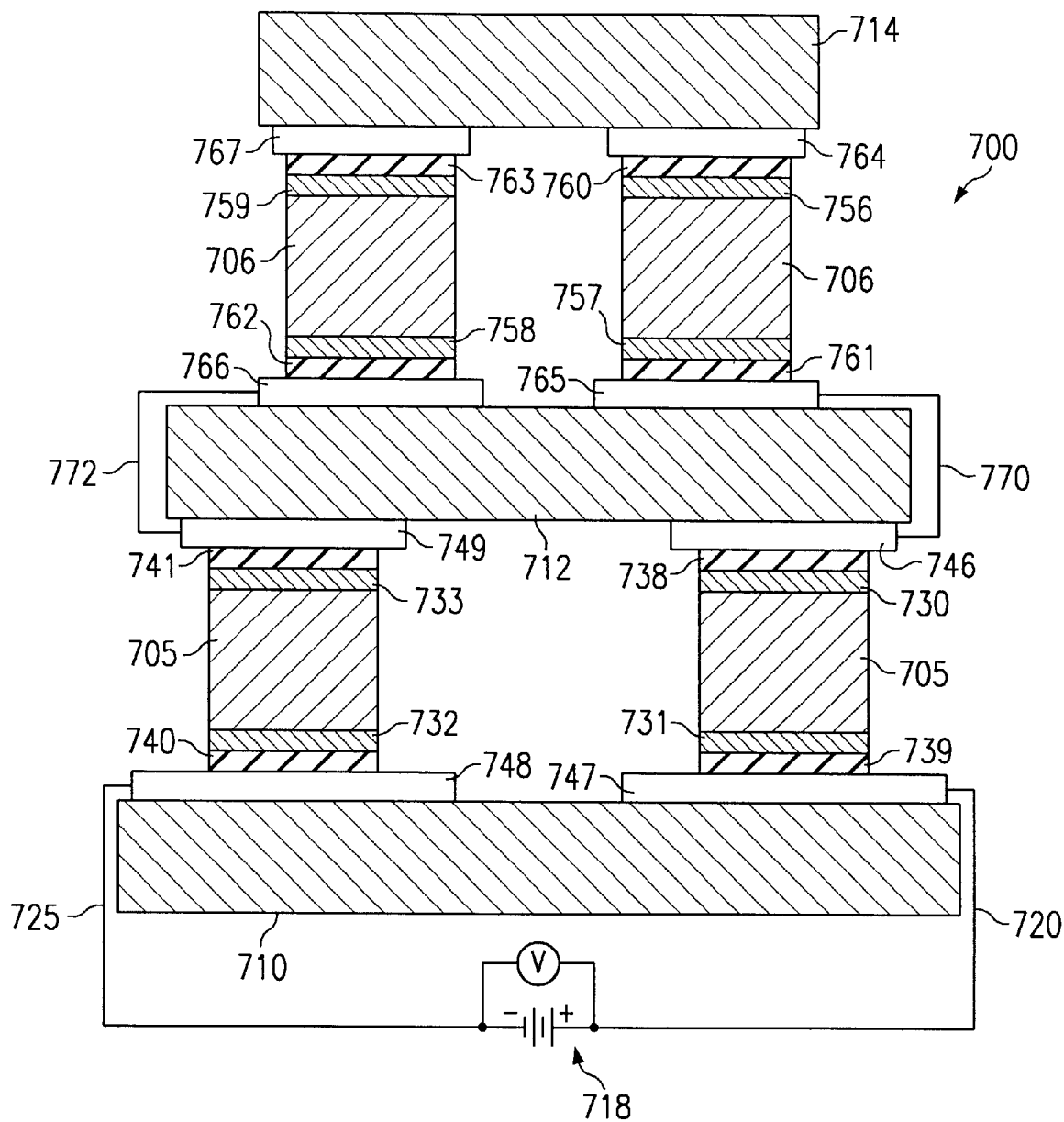
FIG. 7 is schematic drawing in section, with portions broken away, of a multistage thermoelectric device incorporating teachings of the present invention.

FIG. 7 illustrates a multistage thermoelectric device, in accordance with another embodiment of the present invention. Multistage thermoelectric devices provide greater heat transfer than single stage thermoelectric devices. For example, a particular single stage thermoelectric device may operate at a temperature difference of approximately 60° C. between the first and second plate. A second stage may increase the temperature difference across opposite plates to 90° C., and a third stage may increase the temperature difference between opposite plates to 100° C.

Multistage thermoelectric device 700, as shown in FIG. 7, may be fabricated from semiconductor materials and compounds which have been prepared in accordance with teachings of the present invention. Similar to thermoelectric device 100, thermoelectric device 700 may be used as a heater, cooler, or as a power generation device.

Thermoelectric device 700 includes a plurality of thermoelectric elements 705 disposed between a first plate 710 and a second plate 712. The configuration of thermoelectric elements 705 between first plate 710 and second plate 712 may be similar or identical to the configuration of thermoelectric elements 210A and 210B, of FIG. 3.

Electrical power leads 720 and 725 are provided to allow the electrical coupling of thermoelectric device 700 to an appropriate source of electrical power. An electrical circuit formed by electrical power leads 720 and 725 includes components and functionality as described above with regard to electrical circuit 205 of FIG. 2. If thermoelectric device 700 were redesigned to function as an electrical power generator, electrical leads 720 and 725 would represent the output terminals from such a power generator operating between hot and cold temperatures sources.

Thermoelectric device 700 also includes a plurality of thermoelectric elements 706 disposed between second plate 712 and third plate 714. The configuration of thermoelectric elements 706 may be similar or identical to the configuration of thermoelectric elements 705. Alternatively, thermoelectric elements 706 may be configured entirely differently than thermoelectric elements 705.

Ceramic materials are frequently used in the fabrication of plate 710, 712, and 714, which define in part, cold sides and hot sides of thermoelectric device 700. Thermal energy is transported between first plate 710, second plate 712, and third plate 714. Materials suitable for the fabrication of plates 710, 712, and 714 include aluminia oxide, aluminum nitride, and beryllium oxide.

Thermoelectric elements 705 may be formed of semiconductor materials and have their ends connected in a serpentine fashion by attaching diffusion barriers 730–733 to alternating ends of thermoelectric elements 705, similar to thermoelectric elements 210A and 210B of FIG. 3. Bonding joints 738–741are then used to couple thermoelectric elements 705 with interconnects 746–749. Interconnects 746–749 form an interface between thermoelectric elements 705 and first and second plates 710 and 712. Interconnects 746–749 are typically metallizations formed on the surfaces of plates 710, 712, and/or 714. However, in particular embodiments of the present invention, such interconnects may be formed using metal filled glass.

The coupling between thermoelectric elements 706 and plate 712 and 714 are formed in a similar manner. Accordingly, thermoelectric elements 706 include diffusion barriers 756–759, and bonding joints 760–763, coupled with interconnects 764–767.

A pair of electrical power leads 770 and 772 electrically couple interconnects 746 and 749 of thermoelectric elements 705 with interconnects 765 and 766 of thermoelectric elements 706, respectively. In one embodiment, electrical power leads 770 and 772 may be soldered to their respective interconnects. However, in another embodiment, metal filled glass may be used in lieu of solder, in order to form the couplings between electrical power lead 770 and interconnects 746 and 765, and the coupling between electrical power leads 772 and interconnects 749 and 766.

During operation, electrical power is supplied from power supply 718 to thermoelectric device 700. In a particular embodiment, thermal energy may be absorbed by third plate 714, and passed through thermoelectric elements 706 to second plate 712. Thermal energy is also passed from second plate 712 through thermoelectric elements 705 to first plate 710. In this embodiment, a thermal sink may be attached to first plate 710 to aid in dissipating thermal energy from thermoelectric elements 705 and 706. In a similar manner, a thermal sink may be attached to third plate 714, to aid in removing thermal energy from the adjacent environment.

As described above, thermoelectric elements 705 may be arranged between first plate 710 and second plate 712 in a configuration similar to thermoelectric elements 210A and 210B of FIG. 3. Accordingly, a second layer may be coupled with second plate 712 which includes thermoelectric element 706 and third plate 714. Such additional layers increase the efficiency and range of the resulting thermoelectric device. In a similar manner, additional layers including thermoelectric elements and plates, may be "stacked" on top of third plate 714 in order to form multistage thermoelectric devices of almost any size and including any number of thermoelectric elements and plates.

Metal filled glass may be used within the teachings of the present invention to form many of the components of thermoelectric device 700. Similarly, metal filled glass may be used as a bonding agent to couple one or more components of thermoelectric device 700. Examples regarding such usages of metal filled glass are illustrated in more detail in FIGS. 7A–7D.

Figure 7A:
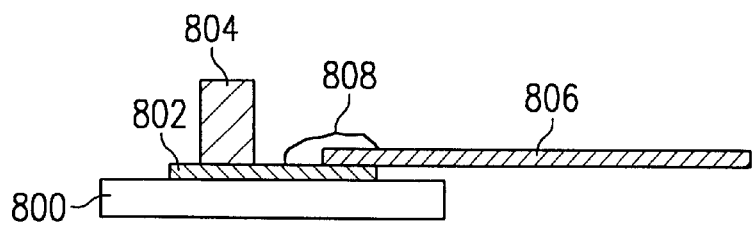
FIG. 7A is a schematic drawing in section, with portions broken away, illustrating a lead wire coupled with a thermoelectric device incorporating teachings of the present invention.

FIG. 7A illustrates a portion of a thermoelectric device, including a plate 800 coupled with an interconnect 802. Interconnect 802 forms an interface between plate 800 and a thermoelectric element 804. A lead wire 806 is coupled with interconnect 802. In the illustrated embodiment of FIG. 7A, metal filled glass 808 is employed as a bonding agent between lead wire 806 and interconnect 802. In a similar manner, metal filled glass may be used to couple any one or more of lead wires 720, 725, 770 and 772 of FIG. 7, to one or more of interconnects 746–749.

Figure 7B:
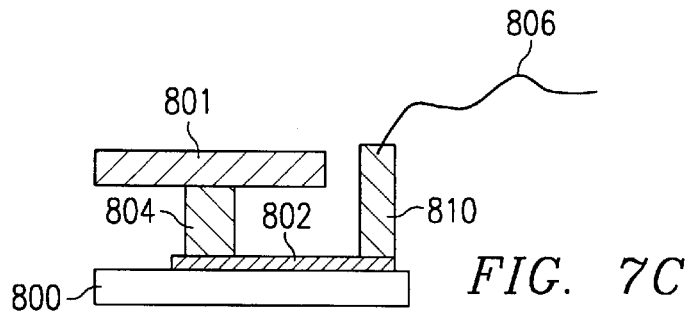
FIG. 7B is a schematic drawing in section, with portions broken away, illustrating a lead wire coupled with a plate of a thermoelectric device, incorporating aspects of the present invention.

FIG. 7B illustrates a portion of a thermoelectric device, including a plate 800 coupled with thermoelectric element 804. In this embodiment, metal filled glass may be used to form the coupling between plate 800 and thermoelectric element 804. Accordingly, metal filled glass functions similarly to the interconnects 746–749, and 764–767 of FIG. 7. Furthermore, metal filled glass 808 may be used to form the coupling between lead wire 806 and plate 800.

Figure 7C:
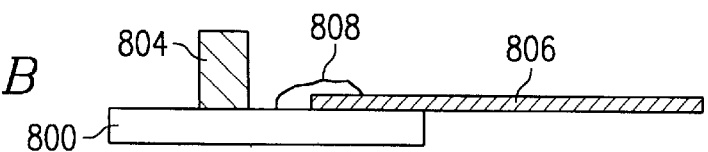
FIG. 7C is a schematic drawing in section, with portions broken away, illustrating a post coupled with the interconnect of a thermoelectric device, incorporating aspects of the present invention.

FIG. 7C illustrates a portion of a thermoelectric device, including a plate 800 and plate 801 with thermoelectric element 804. An interconnect 802 forms the interface between plate 800 and thermoelectric element 804. A post 810 is coupled with interconnect 802. Post 810 allows a user to connect a lead wire 806 with interconnect 802. In the illustrated embodiment of FIG. 7C, lead wire 806 may be coupled with post 810 using metal filled glass. Similarly, metal filled glass may be used to form the coupling between post 810 and interconnect 802. In a particular embodiment, post 810 may include a gold plated post.

Figure 7D:
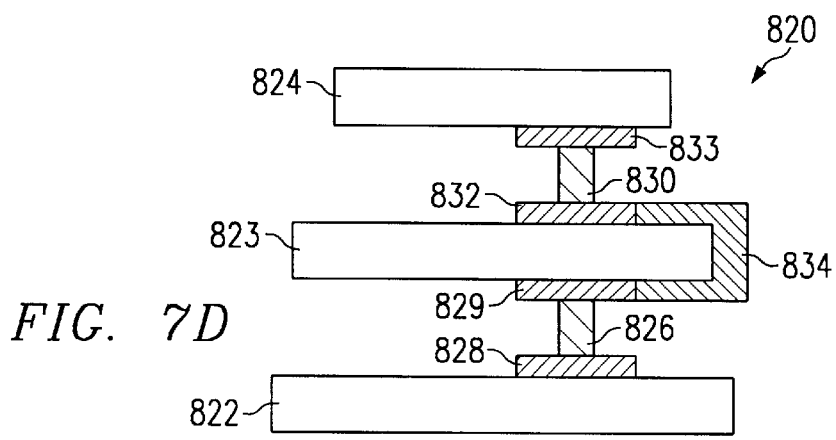
FIG. 7D is a schematic drawing in section, with portions broken away, illustrating metal filled glass electrically coupling to components of a multistage thermoelectric device, incorporating aspects of the present invention.

FIG. 7D illustrates a partial cross-section, with portions broken away, of a multistage thermoelectric device 820. Thermoelectric device 820 includes plates 822–824. A plurality of thermoelectric elements 826 may be disposed between plate 822 and plate 823. Interconnects 828 and 829 may be used to couple thermoelectric element 826 with plate 822 and plate 823, respectively. A plurality of thermoelectric elements 830 may also be disposed between plate 823 and plate 824. Interconnects 832 and 833 may be used to couple thermoelectric element 830 with plates 823 and 824, respectively. In the illustrated embodiment of FIG. 7D, metal filled glass 834 forms an electrical coupling between interconnect 829 and interconnect 832. Accordingly, metal filled glass may be used in lieu of electrical lead wires 770 and 772 of FIG. 7. In an alternative embodiment, where interconnects 829 and 832 are not included, and thermoelectric elements 826 and 830 are coupled directly to plate 823, metal filled glass may be used to electrically couple thermoelectric elements 826 and 830.

Figure 7E:
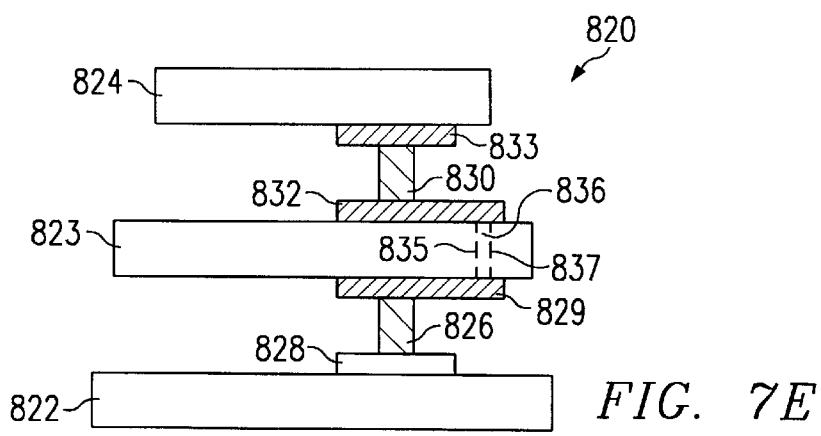
FIG. 7E is a schematic drawing in section, with portions broken away, illustrating metal filled glass in a ceramic thru-hole, incorporating aspects of the present invention.

FIG. 7E illustrates a partial cross-section, with portions broken away, of a multistage thermoelectric device 820, in accordance with another aspect of the present invention. Device 820 includes plates 822–824. A plurality of thermoelectric elements 826 may be disposed between plate 822 and plate 823. Interconnects 828 and 829 may be used to couple thermoelectric element 826 with plates 822 and 823, respectively.

A plurality of thermoelectric elements 830 may also be disposed between plate 823 and plate 824. Interconnects 832 and 833 may be used to couple. thermoelectric element 830 with plates 823 and 824, respectively.

Plate 823 includes a thru-hole 835, which extends from interconnect 832 to interconnect 829. In a particular embodiment of the present invention, thru-hole 835 may be filled with metal filled glass 836. Metal filled glass 836, therefore, electrically couples plate 832 and plate 829. Thru-hole 835 and metal filled glass 836 are used to transfer current between stages of a multistage thermoelectric device.

In accordance with yet another embodiment of the present invention, the interior surface of thru-hole 835 may be plated with a metal 837. In a particular embodiment, the metal may include copper. In this embodiment, the metal filled glass 836 may be bonded to the plated metal 837.

Metal filled glass may be used in lieu of solder, within the teachings of the present invention, for practically any application in which solder has been used previously. In a particular embodiment, silver filled glass may be used. Metal filled glass has many advantages over using solder. For example, metal filled glass can withstand higher temperatures than traditional solder. Furthermore, metal filled glass may have a higher reflow value than solder. Reflow is defined by the temperature at which the solder, or silver filled glass "melts" and loses its bonding characteristics. Furthermore, metal filled glass may be cured at substantially lower temperatures than its reflow value. Therefore, during thermoelectric manufacture, several consecutive steps may be carried out which require temperatures at the cure temperature of metal filled glass, without causing reflow of the metal filled glass already present.

For example, silver filled glass may cure at a temperature of approximately 300° C. However, the reflow value of silver filled glass may be 350° C. The reflow value of solder, however, is typically approximately equal to its reflow value. In a particular embodiment, the cure temperature and reflow temperature of solder may each be approximately equal to 232° C. Another technical advantage of metal filled glass is that particular types are lead free, whereas solder typically contains lead.

Metal filled glass may also be used in lieu of For example, metal filled glass may be used to form one or more of interconnects 746–749 and 764–767. Therefore, the thermoelectric elements may be bonded directly with the plates, rather than first bonding an interconnect to the plate, and then bonding the thermoelectric element to the interconnect. This is made possible in party by the ability of metal filled glass to attach to ceramic, whereas solder cannot. Accordingly, a step of manufacture is deleted. Furthermore, metal filled glass may be coupled directly to ceramic, which is not possible with solder. Metal filled glass includes the ability to conduct electrical current.

Although the present invention and its advantages have been described in detail it should be understood that various changes, substitutions, and alterations can be made hereto without departing from the spirit and scope of the invention as defined by the following claims.

What is claimed is:

1. A thermoelectric device comprising:
   first and second plates having respective first and second surfaces;
   a plurality of leads operably coupled to the first and second plates;

the leads operable to couple the thermoelectric device to a power source;

an array of thermoelectric elements, having respective first and second ends;

metal filled glass operable to couple the first surface of the first plate with the first ends of the thermoelectric elements; and the second ends of the thermoelectric elements operably coupled to the first surface of the second plate.

2. The device of claim 1, further comprising metal filled glass operable to couple the second end of the thermoelectric elements with the first surface of the second plate.

3. The device of claim 1, further comprising a plurality of interconnects operably coupled with the first surface of the first plate and the first end of the thermoelectric elements.

4. The device of claim 1, further comprising a plurality of interconnects formed from metal filled glass on the respective first surfaces of the first and second plates.

5. The device of claim 1 further comprising at least one diffusion barrier formed on the first end of the thermoelectric elements by the metal filled glass.

6. The device of claim 1 further comprising at least one component operably coupled to the second surface of the first plate or the second plate.

7. The device of claim 6 further comprising metal filled glass operable to couple the component and the second surface.

8. The device of claim 6 wherein the component comprises another thermoelectric device.

9. The device of claim 6 wherein the component comprises an integrated circuit.

10. The device of claim 6 wherein the component comprises a thermal sink.

11. The device of claim 1 wherein the metal in the metal filled glass comprises silver.

12. The device of claim 1 wherein the first and second plates comprise ceramic material.

13. A thermoelectric device comprising:

a first plate and a second plate with at least one array of alternatively positioned n-type and p-type thermoelectric elements disposed there between;

the thermoelectric elements having a respective first end and second end;

a plurality of metal filled glass interconnects formed on the first plate and the second plate to respectively connect the first ends of adjacent n-type and p-type thermoelectric elements in series and the second ends of adjacent n-type and p-type thermoelectric elements in series for electrically connecting the array of n-type and p-type thermoelectric elements in a serpentine manner; and first and second leads operably coupled to the thermoelectric element array.

14. A method of fabricating a thermoelectric device comprising:

applying metal filled glass in a desired pattern to a first surface of a first plate and to a first surface of a second plate;

positioning an array of thermoelectric elements, each thermoelectric element having a first end and a second end, on the metal filled glass pattern; and curing the metal filled glass such that the thermoelectric elements are operably coupled to each plate.

15. The method of claim 14 further comprising depositing a plurality of interconnects on the first surface of the first plate and the first surface of the second plate.

16. The method of claim 14 further comprising depositing interconnects made from metal filled glass on the first surface of at least one plate.

17. The method of claim 14 further comprising providing at least one diffusion barrier on at least one end of the thermoelectric elements.

18. The method of claim 14 further comprising:

applying metal filled glass to the second surface of the first plate in a desired pattern; and coupling at least one component to the metal filled glass.

19. The method of claim 18 further comprising:

applying metal filled glass to a third plate; and coupling the third plate to the at least one component.

20. The method of claim 18 further comprising maintaining the plate and the metal filled glass at a temperature above 325° C.

21. A method of fabricating a thermoelectric device comprising:

applying metal filled glass to a first surface of a first plate and to at least a first surface of a second plate in a desired pattern;

positioning first ends of first adjacent n-type and p-type thermoelectric elements into the metal filled glass on the first surface of the first plate;

positioning second ends of first adjacent n-type and p-type thermoelectric elements into the metal filled glass on at least the first surface of the second plate such that the first adjacent n-type and p-type thermoelectric elements are connected in a serpentine manner; and curing the metal filled glass.

22. The method of claim 21 further comprising:

applying metal filled glass to the second surface of the second plate in a desired pattern;

positioning first ends of second adjacent n-type and p-type thermoelectric elements into the metal filled glass on the second surface of the second plate; and positioning second ends of the second adjacent n-type and p-type thermoelectric elements into the metal filled glass on at least a first surface of a third plate such that the second adjacent n-type and p-type thermoelectric elements are connected in a serpentine manner.

23. The method of claim 21 further comprising:

applying metal filled glass to at least one exterior surface of a plate;

coupling at least one component to the metal filled glass on the exterior surface of the plate; and curing the metal filled glass, at a temperature above 325° C.

24. A thermoelectric device comprising:

a first plate and a second plate;

respective interconnects formed on a first surface of the first plate and on a first surface of the second plate;

a plurality of thermoelectric elements having respective first ends and second ends disposed between the first and second plates; and metal filled glass coupling the first and second ends of each thermoelectric elements with the respective interconnects.

25. The thermoelectric device of claim 24 further comprising metal filled glass containing silver.

26. The thermoelectric device of claim 24 further comprising the interconnects formed from metal filled glass.

27. The thermoelectric device of claim 26 further comprising the metal filled glass containing silver.

28. The thermoelectric device of claim 24 further comprising a respective diffusion barrier formed from metal filled glass and disposed on the first end and the second end of each thermoelectric element.

29. The thermoelectric device of claim 28 further comprising the metal filled glass containing silver.

30. A thermoelectric device, comprising:
first and second plates having respective first and second surfaces;
a plurality of leads electrically coupled to the first and second plates;
the leads operable to couple the thermoelectric device to a power source;
an array of thermoelectric elements, having respective first and second ends;
the first and second ends of the thermoelectric elements operably coupled to the first surface of the first plate, and the first surface of the second plate, respectively; and
metal filled glass operable to couple at least one of the plurality of leads to the first or second plate.

31. A thermoelectric device, comprising:
a first plate and a second plate;
at least one interconnect formed on a first surface of the first plate;
a plurality of thermoelectric elements having respective first ends and second ends disposed between the first and second plates; and
metal filled glass coupling the interconnect to the first plate.

32. A thermoelectric device, comprising:
a first plate and a second plate;
a plurality of thermoelectric elements, each having respective first ends and second ends, disposed between the first and second plates; and
first and second diffusion barriers formed from metal filled glass and disposed on the first end and the second end of at least one thermoelectric element, respectively.

33. A thermoelectric device, comprising:
a first plate and a second plate;
at least one interconnect formed on a first surface of the first plate;
at least one lead electrically coupled to the interconnect, the lead operable to couple the thermoelectric device and a power supply;
a plurality of thermoelectric elements, each having respective first ends and second ends, disposed between the first and second plates; and
metal filled glass coupling the lead wire to the interconnect.

34. A thermoelectric device, comprising:
a first plate and a second plate;
a plurality of thermoelectric elements, each having respective first ends and second ends, disposed between the first and second plates;
a post coupled with the first plate and extending generally perpendicular to a first surface of the first plate; and
metal filled glass forming the coupling between the post and the first plate.

35. The thermoelectric device of claim 34, wherein the post comprises gold.

36. A thermoelectric device, comprising:
a first plate and a second plate;
at least one interconnect formed on a first surface of the first plate;
a plurality of thermoelectric elements having respective first ends and second ends disposed between the first and second plates;
a post extending from the interconnect, generally perpendicular to a surface of the interconnect; and
metal filled glass forming the coupling between the post and the interconnect.

37. A multistage thermoelectric device, comprising:
a plurality of components, the components including first, second and third plates, and first and second arrays of thermoelectric elements;
the first array of thermoelectric elements being coupled to and disposed between the first and second plates, and the second array of thermoelectric elements being coupled to and disposed between the second and third plates; and
metal filled glass, wherein the metal filled glass couples at least two of the components.

38. The multistage thermoelectric device of claim 37, wherein the at least two of the components include the first array of thermoelectric elements and the first plate.

39. The multistage thermoelectric device of claim 37, wherein the plurality of components further include an interconnect coupled with the first plate.

40. The multistage thermoelectric device of claim 39, wherein the at least two of the components include the interconnect and the first plate.

41. The multistage thermoelectric device of claim 39, wherein the at least two of the components include the interconnect and the first array of thermoelectric elements.

42. The multistage thermoelectric device of claim 39, wherein the plurality of components further include a post coupled to the interconnect, the post extending generally perpendicular from a surface of the first plate, and wherein the at least two of the components include the post and the interconnect.

43. The multistage thermoelectric device of claim 37, wherein the components further include a plurality of lead wires operable to electrically couple the thermoelectric device and a power source.

44. The multistage thermoelectric device of claim 43, wherein the at least two of the components include at least one of the plurality of lead wires and the first plate.

45. The multistage thermoelectric device of claim 43, wherein the components further include an interconnect coupled with the first plate, and wherein the at least two of the components include at least one of the plurality of lead wires and the interconnect.

46. The multistage thermoelectric device of claim 37, wherein the plurality of components further include at least one post coupled with the first plate and extending generally perpendicular from a surface of the first plate, and wherein the at least two of the components include the post and the first plate.

47. The multistage thermoelectric device of claim 37, wherein the plurality of components further include at least one lead wire operable to electrically couple the first array of thermoelectric elements and the second array of thermoelectric elements.

48. The multistage thermoelectric device of claim 37, wherein the plurality of components further include an interconnect coupled with the second plate and disposed between the first array of thermoelectric elements and the second plate, and wherein the at least two of the components include the interconnect and the lead wire.

49. The multistage thermoelectric device of claim 37, wherein the metal filled glass includes silver.

50. The multistage thermoelectric device of claim 37, further comprising:

first and second interconnects coupled with opposing first and second faces of the second plate, and a thru-hole extending through the second plate from a location adjacent the first interconnect to a location adjacent the second interconnect;

the metal filled glass disposed within the thru-hole; and wherein at least two of the components include the first and second interconnects.

51. The multistage thermoelectric device of claim 50, wherein the interior surface of the thru-hole is plated with metal, and the metal filled glass is coupled with the plated metal.

52. A thermoelectric device, comprising:

a first plate and a second plate;

a plurality of thermoelectric elements each having respective first ends and second ends, disposed between the first and second plates;

a diffusion barrier disposed adjacent each of the first and second ends of at least one of the thermoelectric elements; and wherein at least one of the diffusion barriers include metal filled glass.

53. A method for fabricating a multistage thermoelectric device, comprising:

providing a plurality of components, the components including first, second and third plates, and first and second arrays of thermoelectric elements;

coupling the first array of thermoelectric elements to a first surface of the first plate and a first surface of the second plate, the first array of thermoelectric elements being disposed between the first and second plates;

coupling the second array of thermoelectric elements to a second surface of the second plate and a first surface of the third plate, the second array of thermoelectric elements being disposed between the second and third plates; and using metal filled glass to form the coupling between at least two of the components.

54. The method of claim 53, wherein the plurality of components further include at least one interconnect coupled with the first plate.

55. The method of claim 53, wherein the plurality of components further include at least one lead wire operable to couple the multistage thermoelectric device to a power source.

56. The method of claim 53, wherein the plurality of components further include at least one lead wire operable to electrically couple the first array of thermoelectric elements and the second array of thermoelectric elements.

57. The method of claim 53, further comprising maintaining the metal filled glass at a temperature above 300° C.

* * * * *